(12) United States Patent
Lexa

(10) Patent No.: US 11,333,686 B2
(45) Date of Patent: May 17, 2022

(54) NON-DIRECTIONAL IN-LINE SUSPENDED PCB POWER SENSING COUPLER

(71) Applicant: Tegam, Inc., Geneva, OH (US)

(72) Inventor: Jefferson D. Lexa, Jackson, OH (US)

( * ) Notice: Subject to any disclaimer, the term of this patent is extended or adjusted under 35 U.S.C. 154(b) by 423 days.

(21) Appl. No.: 16/658,467

(22) Filed: Oct. 21, 2019

(65) Prior Publication Data
US 2021/0116479 A1 Apr. 22, 2021

(51) Int. Cl.
| G01R 15/18 | (2006.01) |
| H05K 5/00 | (2006.01) |
| H05K 1/02 | (2006.01) |
| G01R 21/06 | (2006.01) |
| H05K 1/18 | (2006.01) |

(52) U.S. Cl.
CPC ........... *G01R 15/181* (2013.01); *G01R 21/06* (2013.01); *H05K 1/0225* (2013.01); *H05K 1/18* (2013.01); *H05K 5/0069* (2013.01); *H05K 2201/10022* (2013.01); *H05K 2201/10151* (2013.01); *H05K 2201/10189* (2013.01)

(58) Field of Classification Search
CPC .... G01R 15/181; G01R 21/06; H05K 1/0225; H05K 1/18; H05K 5/0069; H05K 2201/10022; H05K 2201/10189
USPC ........................................................ 324/127
See application file for complete search history.

(56) References Cited

U.S. PATENT DOCUMENTS

| 6,704,207 | B2 * | 3/2004 | Kopf ...................... H05K 1/186 361/720 |
| 8,294,530 | B2 * | 10/2012 | Van Swearingen ..... H01P 5/183 333/24 R |
| 9,547,026 | B1 * | 1/2017 | Chraim ................ G01R 21/002 |
| 2002/0015293 | A1 * | 2/2002 | Akiba ..................... H01L 25/16 257/E23.114 |
| 2010/0149777 | A1 * | 6/2010 | Yamamoto ........... H05K 1/0233 29/829 |
| 2011/0204992 | A1 * | 8/2011 | McIntyre .................. H01P 5/18 333/116 |
| 2013/0334321 | A1 * | 12/2013 | Kato ...................... H01Q 13/10 235/493 |
| 2016/0091534 | A1 * | 3/2016 | Emma ............... H01J 37/32935 118/712 |
| 2017/0074908 | A1 * | 3/2017 | Nejatali ............... H04B 5/0081 |
| 2017/0345755 | A1 * | 11/2017 | Uchida ............. H01L 21/32055 |
| 2020/0076137 | A1 * | 3/2020 | Lexa .................. H01R 12/7088 |
| 2021/0111808 | A1 * | 4/2021 | Mita ....................... H03H 7/06 |

* cited by examiner

*Primary Examiner* — Tung X Nguyen
*Assistant Examiner* — Robert P Alejnikov, Jr.
(74) *Attorney, Agent, or Firm* — Brennan, Manna & Diamond, LLC

(57) ABSTRACT

An in-line suspended non-directional power sensor coupling configuration situated within a high frequency transmission line housing that allows non-directional current and sampling voltage elements to all be produced simultaneously on one or more double sided printed circuit boards (PCB). The power sensor coupling allows for repeatable calibrated coupling responses across a much wider frequency range with a single PCB assembly, as opposed to the need to cover equivalently sized frequency ranges with multiple individually fabricated coupling element assemblies.

20 Claims, 9 Drawing Sheets

NON-DIRECTIONAL IN-LINE SUSPENDED PCB POWER SENSING COUPLER

FIELD OF THE INVENTION

The present invention pertains generally to an in-line suspended micro-strip power sensor coupling configuration for use within a high frequency transmission line housing that allows non-directional current and voltage sampling elements to all be produced simultaneously on one single double-sided printed circuit board (PCB).

BACKGROUND OF THE INVENTION

Both discrete and printed circuit board power sensing couplers are known in the art, but oftentimes suffer from performance deviations inherently associated with building individual coupling element configurations that rely upon individual connection of stand-alone discrete electrical components (e.g., resistors, capacitors, and inductors). Said prior power sensing couplers are also relatively expensive to manufacture due to the high cost of fabricating and tuning the resulting individual coupling element assemblies.

Therefore, there is a long felt need in the art for an in-line power sensor coupling configuration for use within a high frequency transmission line housing that allows non-directional current and voltage sampling elements to all be produced simultaneously on one double sided PCB. There is also a need in the art for a power sensing coupler in which the directional power coupling attributes can be transformed into a non-directional power sensing functionality for direct application and use in a class of voltage/current probe sensors used to measure power in a non 50-ohm environment with relative ease. The voltage, current, and the phase between them would need to be measured in order to provide the total power flowing along a transmission line regardless of the type of impedance presented to the sensing component from the load in this type of power sensor.

Further, there is a long-felt need in the art for a non-directional in-line power sensing coupler that can be part of a large-scale production and that affords increased repeatability of performance characteristics relying upon component parameters that can be tightly controlled in the fabrication process. Finally, there is a long felt need in the art for a non-directional in-line power sensing coupler that is relatively inexpensive to manufacture, safe, and easy to use.

SUMMARY OF THE INVENTION

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The present invention includes a power sensing coupler for use with a high frequency, high power transmission line. The power sensing coupler comprises a base and a support component connected to the base. The power sensing coupler further comprises a PCB substrate and a gap comprising a loop area separating the PCB substrate and the support component. The power sensing coupler further comprises a current coupling component comprising a conductor and a terminating resistor in electrical communication with the conductor. The conductor penetrates the gap and extends at least partially into a through hole in the PCB substrate.

The power sensing coupler can measure power from a transmission line non-directionally. The power sensing coupler further comprises a shield layer configured to separate the loop area from the transmission line. The power sensing coupler may further comprise a voltage sampling component located either along the PCB substrate or on a second PCB substrate across from the coupling component.

In an additional embodiment, a non-directional power sensing coupler for measuring power in a transmission line comprises a base and a support component connected to the base. The non-directional power sensing coupler further comprises a PCB substrate and a gap comprising a first loop area and a second loop area separating the PCB substrate and the support component. The non-directional power sensing coupler further comprises a current coupling component comprising a conductor and a terminating resistor in electrical communication with the conductor. The conductor penetrates the gap and extends at least partially into a through hole in the PCB substrate. The non-directional power sensing coupler further comprises a shield layer configured to separate the first and second loop areas from the transmission line.

The non-directional power sensing coupler may further comprise a voltage sampling component located either along the PCB substrate or diametrically across from the current coupling component on a second PCB substrate. The non-directional power sensing coupler may further comprise a second current coupling component located along the PCB substrate. The voltage sampling component is located along the PCB substrate between the current coupling component and the second current coupling component or diametrically across from both the first and second current coupling components on a separate PCB substrate.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

BRIEF DESCRIPTION OF THE FIGURES

While the specification concludes with claims particularly pointing out and distinctly claiming the present invention, it is believed that the present invention will be better understood from the following description in conjunction with the accompanying Figures, in which like reference numerals identify like elements, and wherein:

DETAILED DESCRIPTION

Figure 1:
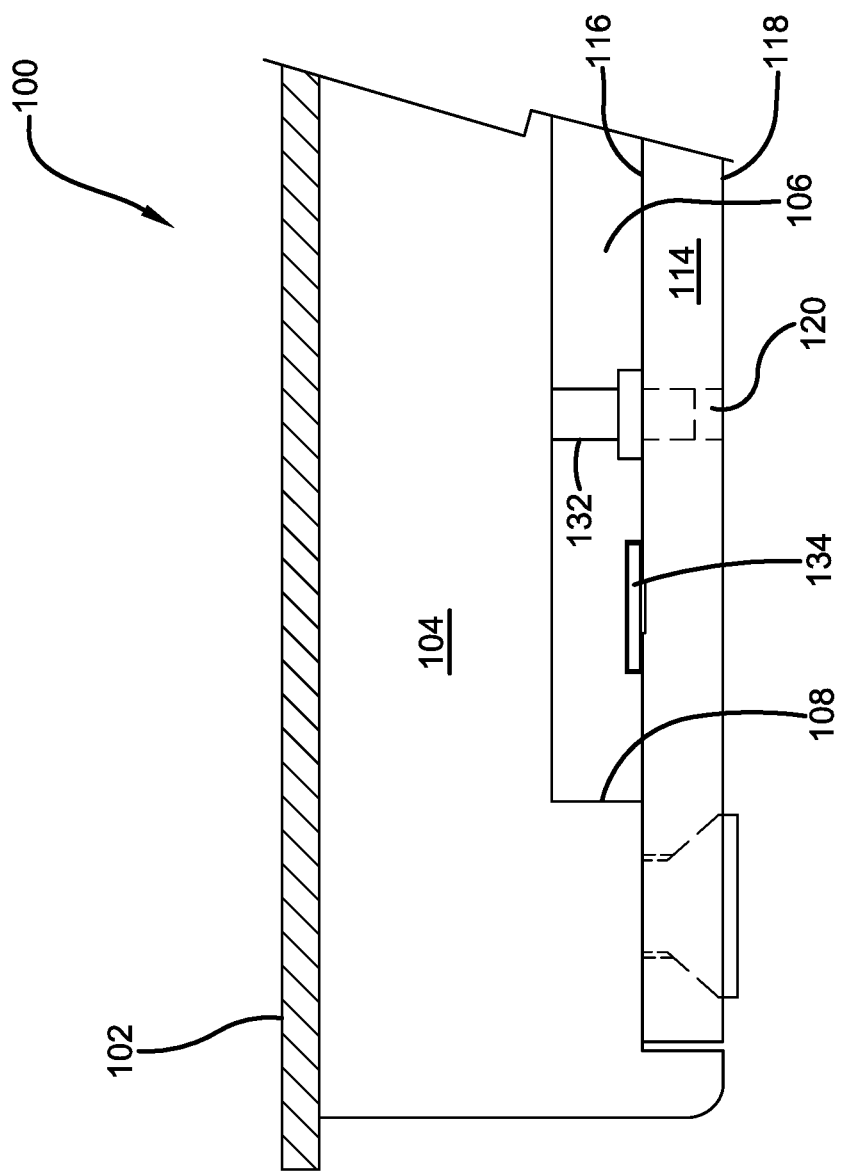
FIG. 1 illustrates a side view of one potential embodiment of a non-directional power sensing coupler of the present invention.

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

The present invention describes a power sensing coupler for use with a high frequency, high power transmission line that allows for non-directional current coupling components and voltage sampling elements to be produced simultaneously on a double-sided printed circuit board (PCB). This is advantageous as it is economical for large scale production and increased repeatability of performance characteristics.

Both the non-directional current coupling components and voltage sampling elements rely on both the distributive nature of the housing structure to which the PCB is attached as well as the printed circuit layout, both of which can be controlled exceptionally well in structural design and fabrication tolerances. All of the components may also be formed simultaneously when the PCB is attached to the housing in a single assembly step and require minimal coupling value tuning thereafter due to the repeatable nature of the fabrication process. The coupling elements formed in this manner are generally more broadband and continuous in nature versus frequency due to their relatively small distributed sizes than existing relatively narrowband approaches where the elements are formed and fabricated individually from discrete components.

The design and implementation of the power sensing coupler still fundamentally remains an inductive loop sampling device, and therefore the induced voltage output from each coupling element is dependent upon the frequency applied to it. The coupling response characteristic is substantially linear in response to logarithmic frequency with an approximately 20 dB/decade slope and will normally require some type of equalization circuit to present a more controlled dynamic range input to downstream detection circuitry.

Non-directional power sensing capability is useful in a class of voltage and current probe sensors capable of measuring power in a transmission line in a non-50-ohm environment. This type of sensor must have the capability of measuring voltage, current, and the phase between them in order to provide the total power flowing along the transmission line. This is true regardless of the type of impedance presented to the sensing component from the transmission line load.

Referring initially to the drawings, FIGS. 1-6 illustrates one embodiment of a power sensing coupler 100 of the present invention. The power sensing coupler 100 is a non-directional power sensing coupler and is coupleable with and configured to measure power in a transmission line 10. The power sensing coupler 100 comprises a base 102, a support component 104, and a printed circuit board (PCB) substrate 114. The support component 104 is attached or otherwise connected to or integrated with the base 102.

The PCB substrate 114 comprises an inner surface 116, an outer surface 118, and a through hole 120. The power sensing coupler 100 further comprises a gap 106 comprising a perimeter 108 and a loop area 110. The loop area 110 separates the PCB substrate 114 from the support component 104 with the inner surface 116 of the PCB substrate facing the support component 104. The loop area 110 is generally a loop arm that functions as an inductive coupling loop.

Figure 2:
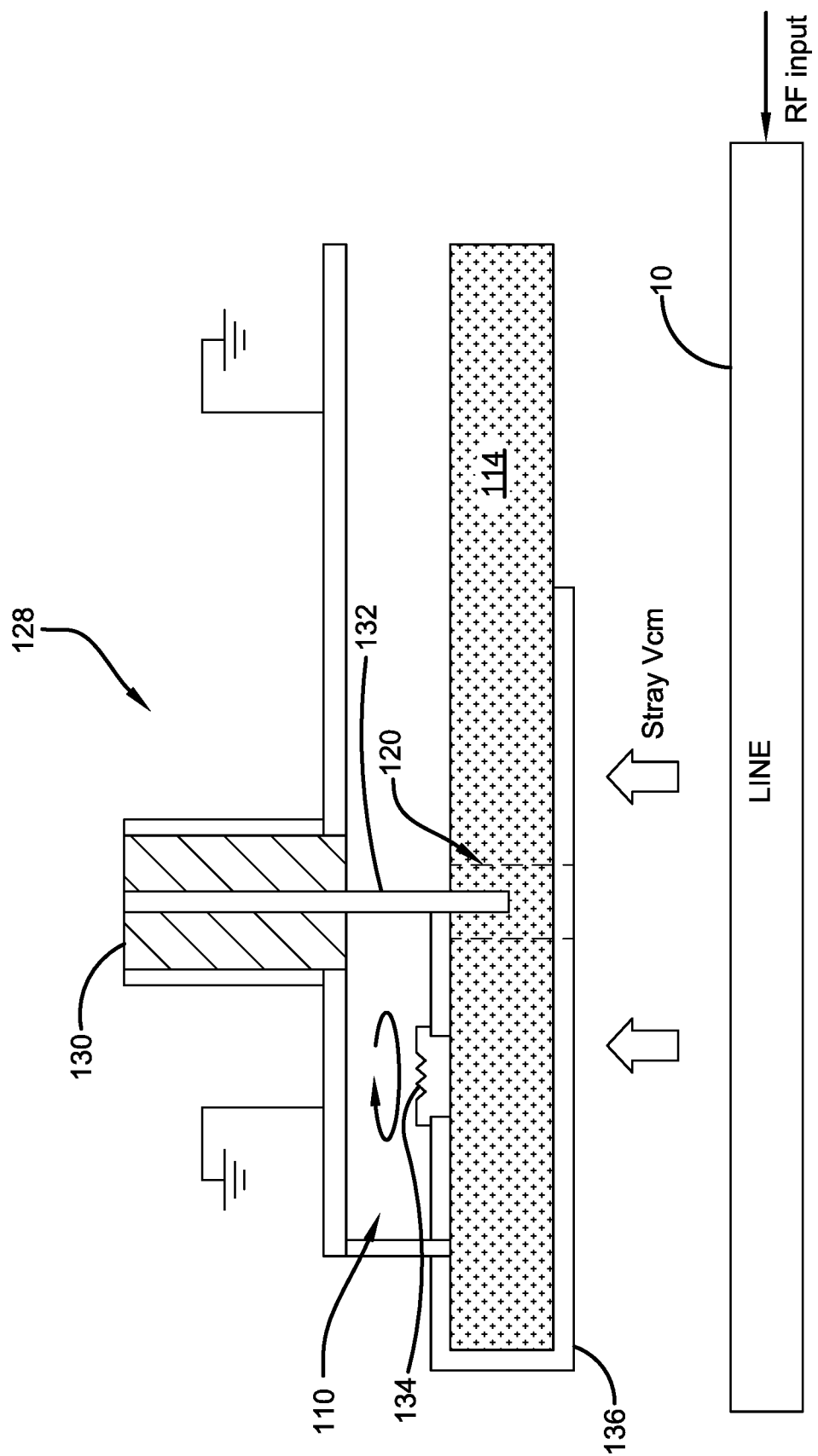
FIG. 2 illustrates a schematic diagram of a current coupling component of the non-directional power sensing coupler coupled to a transmission line of the present invention.
Figure 3:
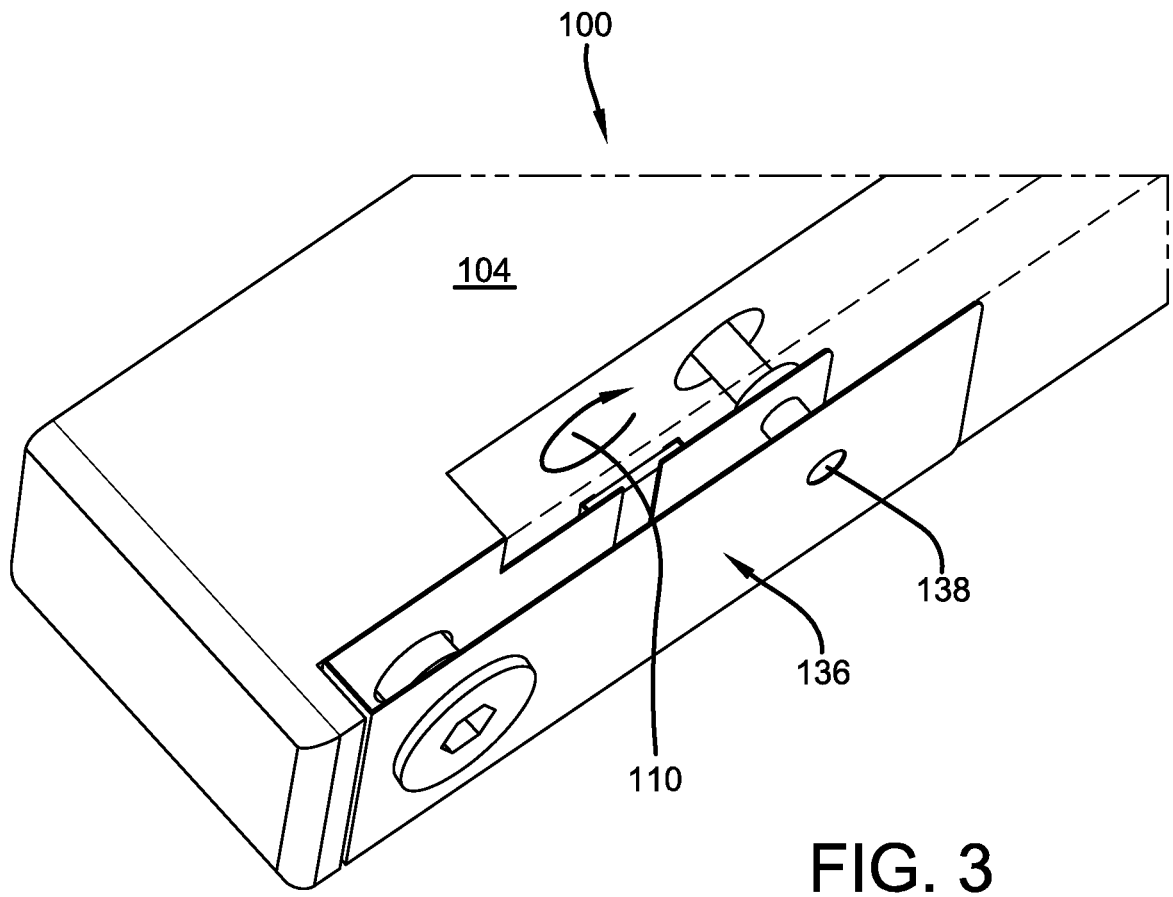
FIG. 3 illustrates a perspective view of the non-directional power sensing coupler of the present invention.
Figure 4:
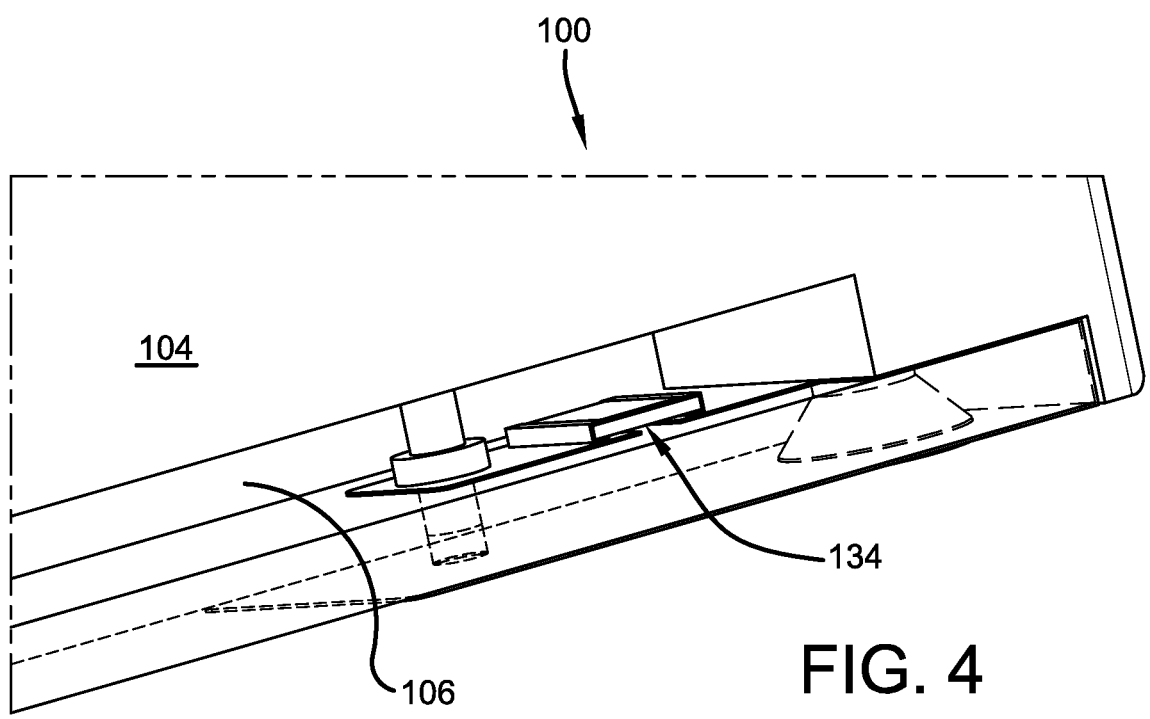
FIG. 4 illustrates a perspective view of the non-directional power sensing coupler of the present invention.
Figure 5:
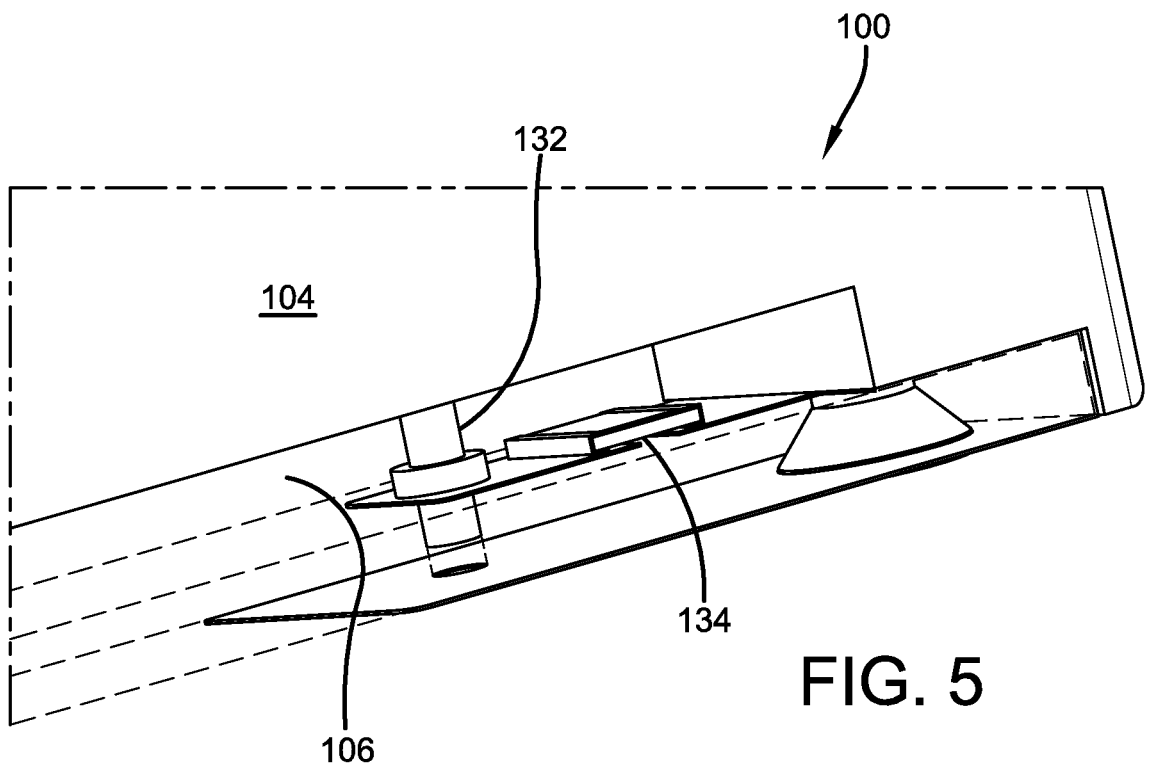
FIG. 5 illustrates a perspective view of the non-directional power sensing coupler of the present invention.

As illustrated in FIG. 2, the power sensing coupler 100 further comprises a current coupling component 128. The current coupling component 128 comprises a conductor 132, a resistor 134, and a coaxial output 130. The conductor 132 penetrates the gap 106 and extends at least partially into the through hole 120 in the PCB substrate 114. Typically, the conductor 132 does not completely penetrate the PCB substrate 114 through the through hole 120. The partial penetration of the conductor 132 into the PCB substrate 114 reduces stray electrostatic voltages to the conductor 132 from common mode voltages on the main transmission line 10. The resistor 134 is a terminating resistor in electrical communication with the conductor 132.

The current coupling component 128 further comprises a shield layer 136. The shield layer 136 is located between the loop area 110 and the transmission line 10 and extends along the outer surface 118 of the PCB substrate 114 around and past the through hole 120 retaining the conductor 132. The shield layer 136 comprises a hole 138. The hole 138 in the shield layer 136 keeps the conductor 132 from contacting the shield layer 136 as illustrated in FIG. 6.

The shield layer 136 acts as a ground plane and protects and shields the loop area 110, the conductor 132, and the current coupling component 128 from any stray main transmission line electrostatic voltages. The power sensing coupler 100 does not use a capacitive tuning tab and its configuration is intended to minimize its existence to the fullest extent possible. The power sensing coupler 100 instead extends the shield layer 136 around the through hole 120 in the PCB substrate 114 as much as possible but leaves the hole 138 in the shield layer 136 where the conductor 132 remains coupled to the loop area 110 on both sides of the PCB substrate 114. This has the effect of producing an output voltage at the coaxial output 130 that is dependent only upon the loop voltage itself regardless of the direction of current flow, and not on a composite sum of loop voltage plus any common mode electrostatic voltage resulting in very different magnitudes of composite sums depending on the direction of current flow. These different magnitudes of composite voltage sums dependent on directional current flow is exactly the desired outcome when an intentionally introduced tuning tab is used to inject common mode voltage into the loop voltage in a directional coupler configuration.

Figure 6:
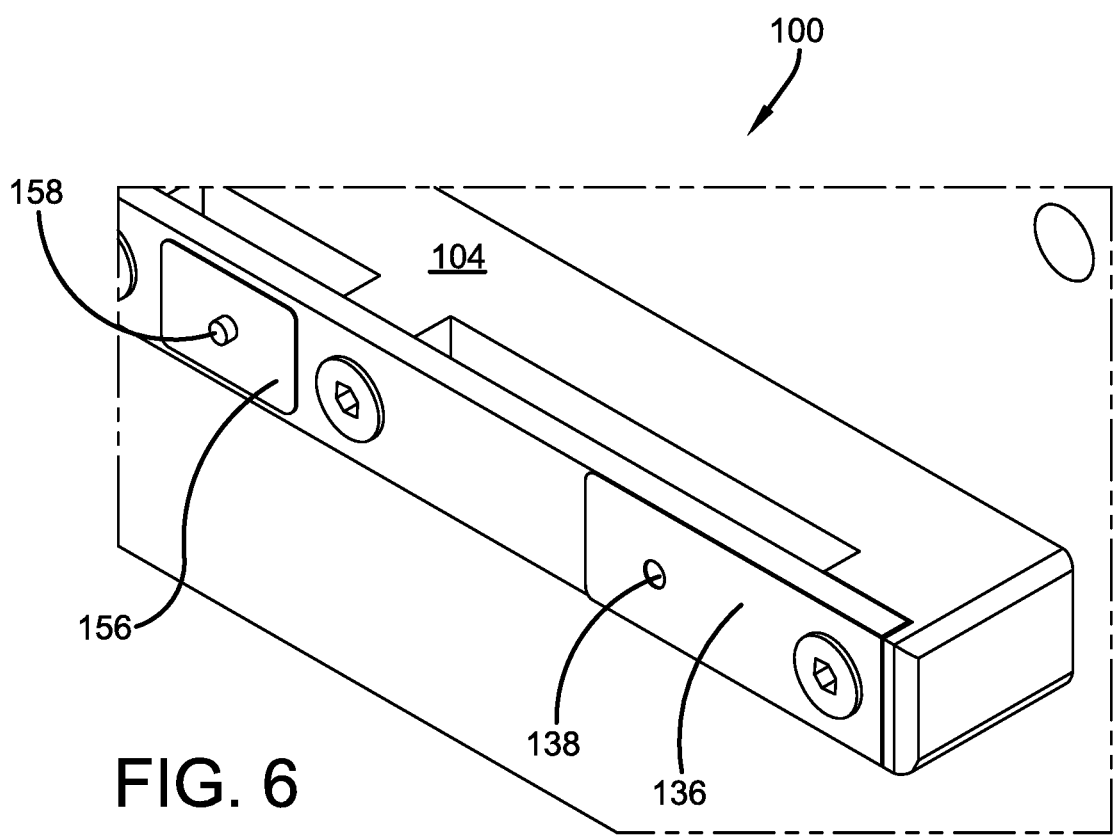
FIG. 6 illustrates an underneath view of the non-directional power sensing coupler of the present invention.
Figure 7:
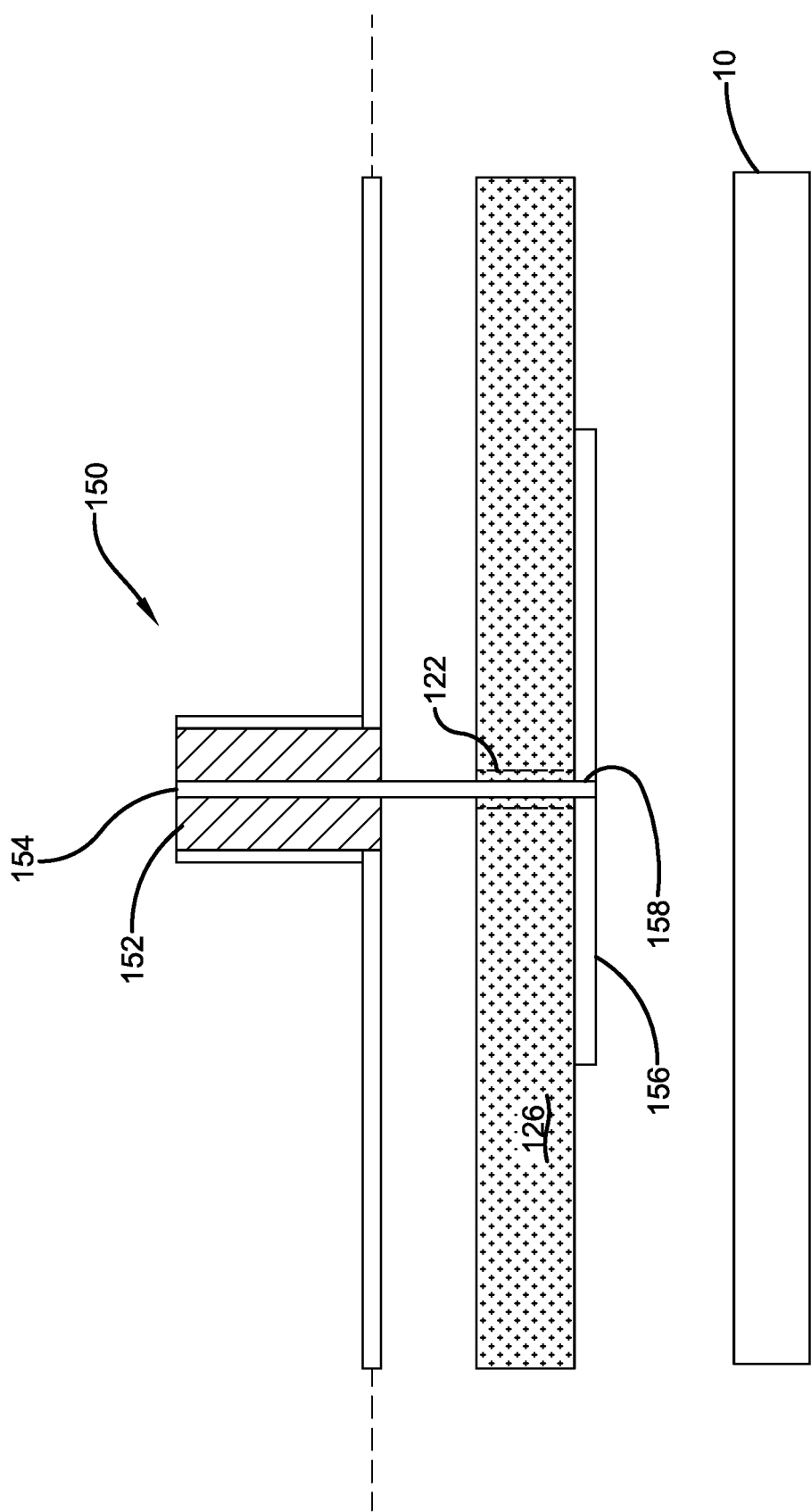
FIG. 7 illustrates a schematic diagram of a voltage sampling component of the non-directional power sensing coupler of the present invention.

As illustrated in FIGS. 6 and 7, the power sensing coupler 100 may further comprise a voltage sampling component 150. The voltage sampling component 150 comprises a conductor 154, a voltage coaxial output 152, and a voltage sampling plate 156. The voltage sampling component 150 may be located axially along the PCB substrate 114 or on a second PCB substrate 126 separate from the first PCB substrate 114 diametrically across from the current coupling component 128. The conductor 154 penetrates the gap 106 and extends into a second through hole 122 in the PCB substrate 114. The voltage sampling plate 156 of the voltage sampling component 150 is located along the outer surface 118 of the PCB substrate 114. The voltage sampling plate 156 comprises a hole 158. The hole 158 in the voltage sampling plate 156 is in electrical communication with the conductor 154 residing in the through hole 122.

As configured, the loop area 110 output voltage will respond substantially equally to both forward and reverse travelling waves from the transmission line 10 producing a vector output summation representing the total resultant current on the transmission line 10. The total voltage on the transmission line 10 is provided by the voltage sampling component 150, thereby resulting in a power sensing coupler 100 capable of providing both current and voltage sensing capability, wherein the outputs 130 and 152 can be suitably processed to measure power. As such, the power sensing coupler 100 is configured to measure the composite vector sum of bi-directional current flow along the transmission line, and when combined with a voltage probe, is configured to measure power from the transmission line 10 in a non 50-ohm environment. The single loop configuration with a single current output of the non-directional power sensing coupler 100 as described is desirable when space is of paramount importance. The loop area 110 of the current coupling component 128 is located diametrically across from the voltage sampling component 150 located on the second PCB substrate 126 in the same plane along the axis of the transmission line 10 conductor for a compact configuration.

The power sensing coupler 100 is configurable so that the loop area 110 and the voltage sampling component 150 can be located on either the single PCB substrate 114 axially; or so that the loop area 110 and the voltage sampling component 150 are located diametrically across from each other on separate PCB substrates (114 and 126) for a more compact axial configuration.

FIGS. 8-11 illustrate another embodiment of a non-directional power sensing coupler 200 coupleable to a transmission line 10. The non-directional power sensing coupler 200 utilizes two non-directional current sensing loops opposed approximately 180 degrees from each other in a single structure which can be used to combine differentially together, double the loop voltage output, and further reduce any stray residual common mode voltages that would exist at each loop. This will result in further purifying the total current vector from any corrupting stray common mode voltage vectors that can alter the total current resultant phase angle, thereby significantly improving the accuracy of the resulting power calculation that relies on the measured phase angle between the voltage and current vectors.

The non-directional power sensing coupler 200 comprises a base 202, a support component 204, and a printed circuit board (PCB) substrate 214. The support component 204 is attached or otherwise connected to or integrated with the base 202. The PCB substrate 214 comprises a through hole 220. The non-directional power sensing coupler 200 further comprises a gap 206 comprising a first loop area 210 and a second loop area 212. The first loop area 210 separates the PCB substrate 214 from the support component 204 with an inner surface of the PCB substrate 214 facing the support component 204 at one end of the non-directional power sensing coupler 200. The second loop area 212 separates the PCB substrate 214 from the support component 204 with an inner surface of the PCB substrate 214 facing the support component 204 at the opposite end of the non-directional power sensing coupler 200 from the first loop area 210. The first and second loop areas 210 and 212 are generally loop arms that function as inductive coupling loops.

Figure 8:
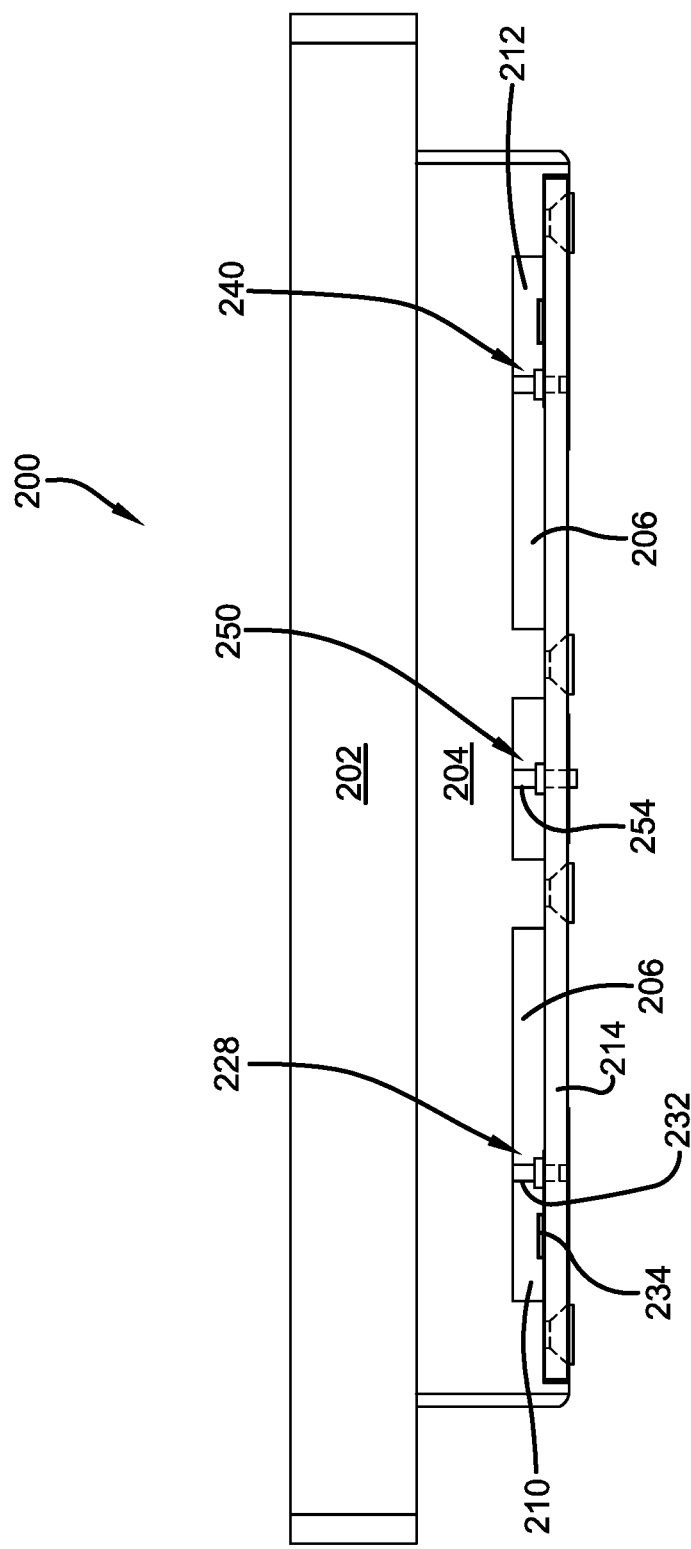
FIG. 8 illustrates a side view of one potential embodiment of a non-directional power sensing coupler comprising a current coupling component and a second current coupling component of the present invention.

As illustrated in FIG. 8, the non-directional power sensing coupler 200 further comprises a current coupling component 228. The current coupling component 228 comprises a conductor 232, a resistor 234, and a coaxial output (not shown, but comparable to output 130 in the embodiment illustrated in FIG. 2). The conductor 232 penetrates the gap 206 and extends at least partially into the through hole 220 in the PCB substrate 214. Typically, the conductor 232 does not completely penetrate the PCB substrate 214 through the through hole 220. The partial penetration of the conductor 232 into the PCB substrate 214 reduces stray electrostatic voltages to the conductor 232 from common mode voltages on the main transmission line 10. The resistor 234 is a terminating resistor in electrical communication with the conductor 232.

The current coupling component 228 further comprises a shield layer 236. The shield layer 236 is located between the first loop area 210 and the transmission line 10 and extends along the outer surface of the PCB substrate 214 around and past the through hole 220 retaining the conductor 232. The shield layer 236 comprises a hole 238. The hole 238 in the shield layer 236 keeps the conductor 232 from contacting the shield layer 236 as illustrated in FIG. 9.

The shield layer 236 acts as a ground plane and protects and shields the first loop area 210, the conductor 232, and the current coupling component 228 from any stray main transmission line electrostatic voltages. As such, the power sensing coupler 200 is configured to measure power from the transmission line 10 in a non 50-ohm environment.

Figure 9:
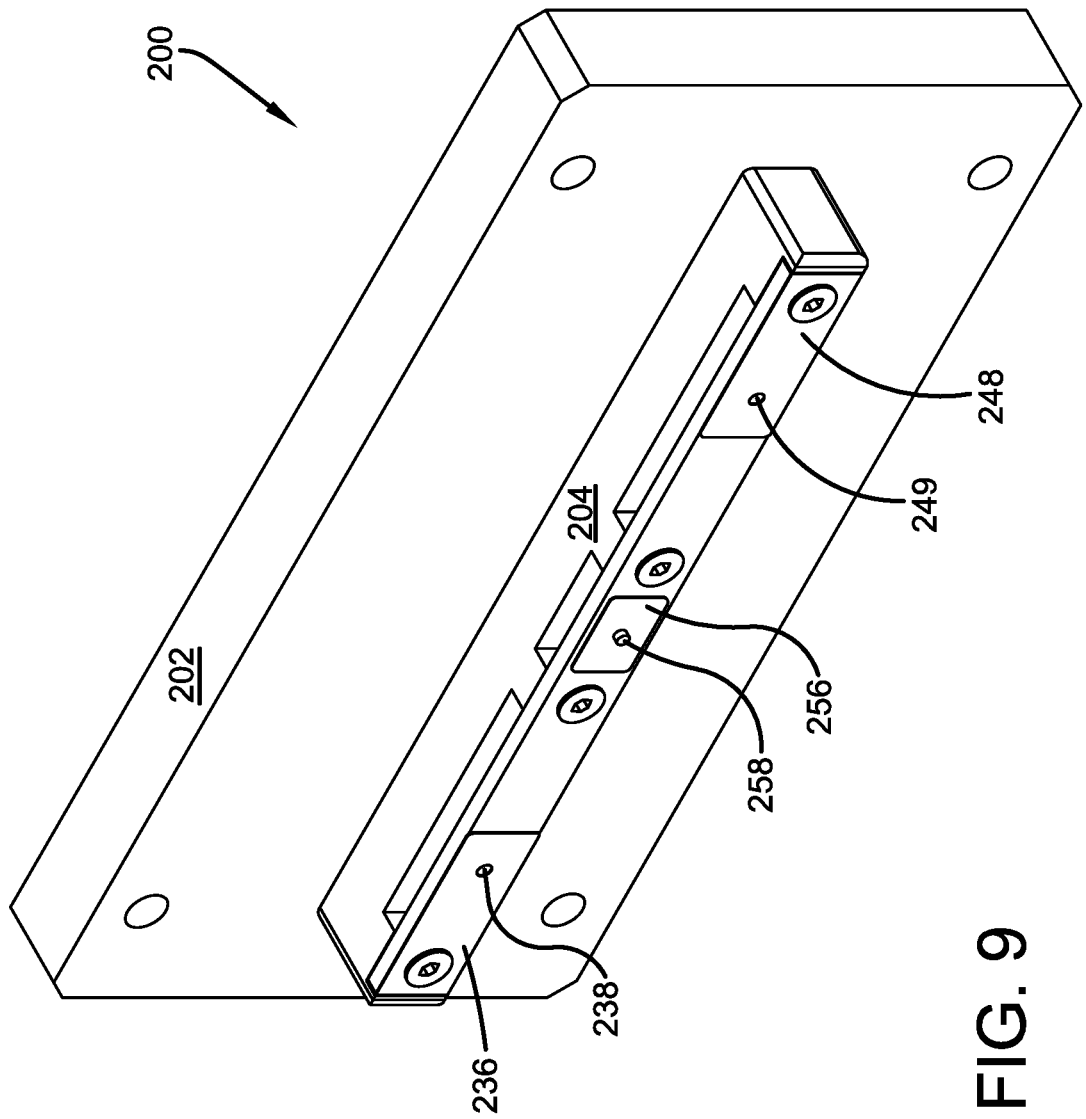
FIG. 9 illustrates an underneath view of the non-directional power sensing coupler of the present invention.
Figure 10:
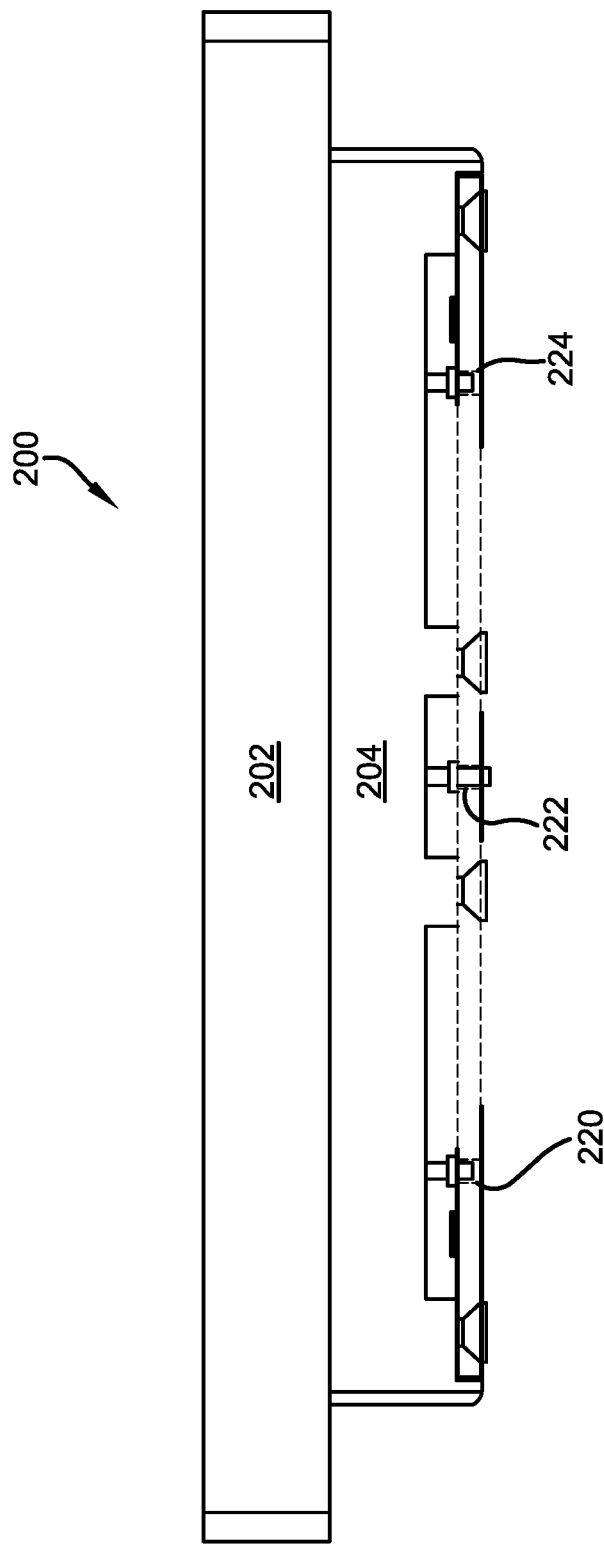
FIG. 10 illustrates a side view of the non-directional power sensing coupler of the present invention.

As illustrated in FIGS. 8-10, the non-directional power sensing coupler 200 further comprises a voltage sampling component 250. The voltage sampling component 250 comprises a conductor 254, a voltage coaxial output (not shown, but comparable to output 152 in the embodiment illustrated in FIG. 7), and a voltage sampling plate 256. The voltage sampling plate 256 is used to sample a portion of the voltage from the main transmission line. The voltage sampling component 250 may be located axially along the PCB substrate 214 between the first and second loop areas 210 and 212, or on a separate PCB substrate (not shown) located diametrically across from a midpoint between the first and second loop areas 210 and 212. The conductor 254 penetrates the gap 206 and extends at least partially into a second through hole 222 in the PCB substrate 214. The voltage sampling plate 256 of the voltage sampling component 250 is located along the outer surface of the PCB substrate 214. The voltage sampling plate 256 comprises a hole 258. The hole 258 in the voltage sampling plate 256 is in electrical communication with the conductor 254 residing in the second through hole 222.

Figure 11:
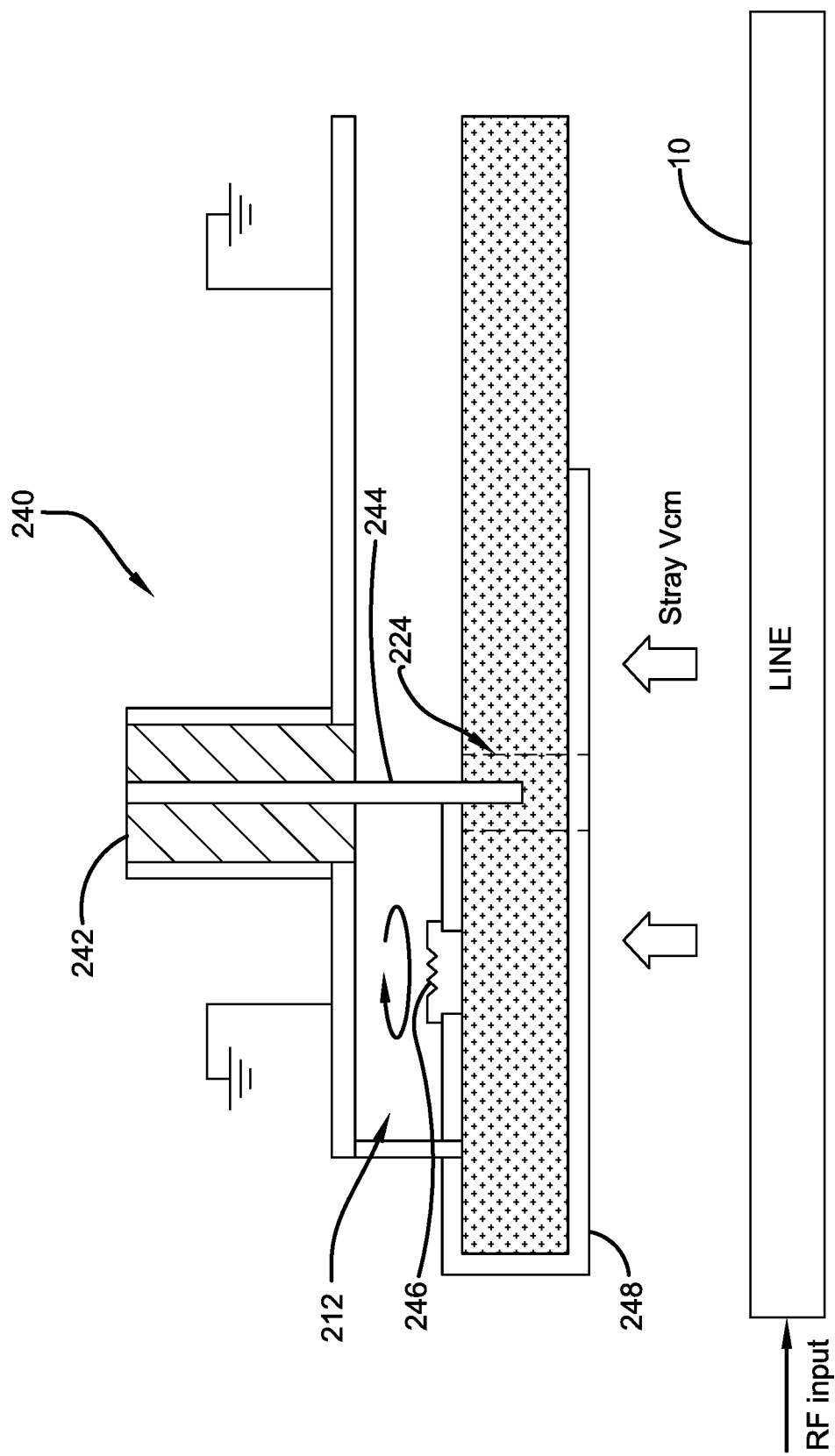
FIG. 11 illustrates a schematic diagram of a second current coupling component of the non-directional power sensing coupler of the present invention.

As illustrated in FIG. 11, the non-directional power sensing coupler 200 further comprises a second current coupling component 240. The second current coupling component 240 comprises a second conductor 244, a second resistor 246, and a second coaxial output 242. The second conductor 244 penetrates the gap 206 and extends at least partially into a third through hole 224 in the PCB substrate 214. Typically, the second conductor 244 does not completely penetrate the PCB substrate 214 through the third through hole 224. The partial penetration of the second conductor 244 into the PCB substrate 214 reduces stray electrostatic voltages to the second conductor 244 from common mode voltages on the main transmission line 10. The second resistor 246 is a terminating resistor in electrical communication with the second conductor 244.

The second current coupling component 240 is located along the PCB substrate 214 in a mirror image about a midpoint of the PCB substrate 214 opposite to the current coupling component 228. The second current coupling component 240 further comprises a shield layer 248. The shield layer 248 is located between the second loop area 212 and the transmission line 10 and extends along the outer surface of the PCB substrate 214 around and past the third through hole 224 retaining the second conductor 244. The shield layer 248 comprises a hole 249. The hole 249 in the shield layer 248 keeps the second conductor 244 from contacting the shield layer 248. The shield layers 236 and 248 extend around the respective through holes 220 and 224 at both the first and second loop areas 210 and 212.

As illustrated in FIG. 8-10, the voltage sampling component 250 is typically located approximately midway along the PCB substrate 214 between the current coupling component 228 and the second current coupling component 240. The current coupling component 228 and the second current coupling component 240 are configured to reduce residual common mode voltages existing at the first and second loop areas 210 and 212. By using two loops in a mirror image opposed to each other along the main conductor axis enables their outputs to be combined differentially to further reject any stray common mode voltages that may exist on the resulting current vector loop output.

The non-directional power sensing coupler 200 is configurable so that the first loop area 210, the second loop area 212, and the voltage sampling component 250 are located on either the single PCB substrate 114 axially. Alternatively, the first loop area and the second loop area may be located on the same PCB substrate and the voltage sampling component is located on a separate PCB substrate diametrically across from the PCB substrate retaining the first second loop areas. In yet another configuration, the first loop area and the second loop area may be located on separate PCB substrates diametrically across from each other with the voltage sampling component located on a third PCB substrate midway between the first second loop areas on either side of the circumferential loop plane for a more compact configuration.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A power sensing coupler for use with a transmission line comprising:
   a base;
   a support component connected to the base;
   a printed circuit board (PCB) substrate;
   a gap comprising a loop area separating the PCB substrate from the support component; and
   a current coupling component comprising a conductor penetrating the gap and extending at least partially into a through hole in the PCB substrate and a terminating resistor in electrical communication with the conductor.

2. The power sensing coupler of claim 1, wherein the current coupling component further comprises a shield layer located between the loop area and the transmission line.

3. The power sensing coupler of claim 1, wherein the loop area is an inductive coupling loop.

4. The power sensing coupler of claim 1 further comprising a voltage sampling component located axially along the PCB substrate diametrically across from the current coupling component.

5. The power sensing coupler of claim 1 further comprising a voltage sampling component located on a second PCB substrate diametrically across from the current coupling component.

6. The power sensing coupler of claim 5, wherein the power sensing coupler is configured to measure power in a non 50-ohm environment.

7. The power sensing coupler of claim 1, wherein the gap further comprises a second loop area separating the PCB substrate from the support component.

8. The power sensing coupler of claim 6 further comprising a second current coupling component located symmetrically or in a mirror image about a midpoint along the PCB substrate opposite to the current coupling component.

9. A non-directional power sensing coupler coupleable to a transmission line comprising:
   a base;
   a support component connected to the base;
   a printed circuit board (PCB) substrate;
   a gap comprising a loop area separating the PCB substrate from the support component;
   a current coupling component comprising a conductor penetrating the gap and extending at least partially into a through hole in the PCB substrate and a terminating resistor in electrical communication with the conductor; and
   a shield layer separating the loop area from the transmission line.

10. The non-directional power sensing coupler of claim 9, wherein the shield layer is a ground plane.

11. The non-directional power sensing coupler of claim 9, wherein the shield layer protects the loop area and the current coupling component from stray or common mode electrostatic voltages.

12. The non-directional power sensing coupler of claim 9, wherein a loop output voltage responds substantially equally to both forward and reverse traveling waves from the transmission line.

13. The non-directional power sensing coupler of claim 9, wherein the conductor does not completely penetrate the PCB substrate.

14. The non-directional power sensing coupler of claim 13, wherein the partial penetration of the conductor into the PCB substrate reduces stray electrostatic voltages to the conductor from common mode voltages on the transmission line.

15. A non-directional power sensing coupler coupleable to a transmission line comprising:
   a base;
   a support component connected to the base;
   a printed circuit board (PCB) substrate;
   a gap comprising a first loop area and a second loop area separating the PCB substrate from the support component;

a current coupling component comprising a conductor penetrating the gap and extending at least partially into a through hole in the PCB substrate and a terminating resistor in electrical communication with the conductor; and a shield layer separating the first and second loop areas from the transmission line.

16. The non-directional power sensing coupler of claim 15 further comprising a voltage sampling component located along the PCB substrate.

17. The non-directional power sensing coupler of claim 15 further comprising a second current coupling component located symmetrically or in a mirror image about a midpoint along the PCB substrate opposite to the current coupling component.

18. The non-directional power sensing coupler of claim 17 further comprising a voltage sampling component located along the PCB substrate between the current coupling component and the second current coupling component.

19. The non-directional power sensing coupler of claim 17, wherein the current coupling component and the second current coupling component are configured to reduce residual common mode voltages existing at the first and second loop areas.

20. The non-directional power sensing coupler of claim 15, wherein the shield layer extends around the through hole at both the first and second loop areas.

* * * * *